US010319648B2

(12) United States Patent
Smith et al.

(10) Patent No.: US 10,319,648 B2
(45) Date of Patent: Jun. 11, 2019

(54) CONDITIONS FOR BURN-IN OF HIGH POWER SEMICONDUCTORS

(71) Applicant: Transphorm Inc., Goleta, CA (US)

(72) Inventors: Kurt Vernon Smith, Santa Barbara, CA (US); Likun Shen, Goleta, CA (US); David Michael Rhodes, Santa Barbara, CA (US); Ronald Avrom Barr, Santa Barbara, CA (US); James Leroy McKay, Santa Barbara, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 15/955,515

(22) Filed: Apr. 17, 2018

(65) Prior Publication Data

US 2018/0301386 A1 Oct. 18, 2018

Related U.S. Application Data

(60) Provisional application No. 62/486,417, filed on Apr. 17, 2017.

(51) Int. Cl.
*H01L 21/00* (2006.01)
*H01L 21/66* (2006.01)
(Continued)

(52) U.S. Cl.
CPC .......... *H01L 22/20* (2013.01); *G01R 31/2642* (2013.01); *H01L 21/4853* (2013.01);
(Continued)

(58) Field of Classification Search
CPC ................. H01L 22/20; H01L 21/4853; H01L 21/67271; H01L 21/78; H01L 29/2003; H01L 29/7787; G01R 31/262
See application file for complete search history.

(56) References Cited

U.S. PATENT DOCUMENTS

| 4,321,489 A | 3/1982 | Higuchi et al. |
| 4,384,287 A | 5/1983 | Sakuma |

(Continued)

FOREIGN PATENT DOCUMENTS

| CN | 1682445 | 10/2005 |
| CN | 1921148 | 2/2007 |

(Continued)

OTHER PUBLICATIONS

Authorized officer Keon Hyeong Kim, International Search Report and Written Opinion in PCT/US2008/076160 dated Mar. 18, 2009, 11 pages.

(Continued)

*Primary Examiner* — Richard A Booth
(74) *Attorney, Agent, or Firm* — Fish & Richardson P.C.

(57) ABSTRACT

Techniques for improving reliability of III-N devices include holding the III-N devices at a first temperature less than or equal to 30° for a first period of time while applying a first gate-source voltage lower than a threshold voltage of the III-N devices and a first drain-source voltage greater than 0.2 times a break down voltage of the III-N devices; and holding the III-N devices at a second temperature greater than the first temperature for a second period of time while applying a second gate-source voltage lower than a threshold voltage of the III-N devices and a second drain-source voltage greater than 0.2 times a breakdown voltage of the III-N devices. After holding the III-N devices at the first and second temperatures, screening the III-N devices based on electrical performance of one or more parameters of the III-N devices.

35 Claims, 5 Drawing Sheets

(51) Int. Cl.
  *H01L 21/48* (2006.01)
  *H01L 21/78* (2006.01)
  *G01R 31/26* (2014.01)
  *H01L 29/20* (2006.01)
  *H01L 29/778* (2006.01)
  *H01L 21/67* (2006.01)

(52) U.S. Cl.
  CPC ........ *H01L 21/67271* (2013.01); *H01L 21/78* (2013.01); *H01L 29/2003* (2013.01); *H01L 29/7787* (2013.01)

(56) References Cited

U.S. PATENT DOCUMENTS

| | | | |
|---|---|---|---|
| 4,665,508 A | 5/1987 | Chang | |
| 4,728,826 A | 3/1988 | Einzinger et al. | |
| 4,808,853 A | 2/1989 | Taylor | |
| 4,864,479 A | 9/1989 | Steigerwald et al. | |
| 5,198,964 A | 3/1993 | Ito et al. | |
| 5,379,209 A | 1/1995 | Goff | |
| 5,381,103 A * | 1/1995 | Edmond | G01R 31/2635 324/754.06 |
| 5,493,487 A | 2/1996 | Close et al. | |
| 5,637,922 A | 6/1997 | Fillion et al. | |
| 5,767,573 A | 6/1998 | Noda et al. | |
| 5,789,951 A | 8/1998 | Shen et al. | |
| 5,952,856 A | 9/1999 | Horiguchi et al. | |
| 6,008,684 A | 12/1999 | Ker et al. | |
| 6,091,079 A * | 7/2000 | Green | G01R 31/2642 257/48 |
| 6,107,844 A | 8/2000 | Berg et al. | |
| 6,130,831 A | 10/2000 | Matsunaga | |
| 6,172,550 B1 | 1/2001 | Gold et al. | |
| 6,333,617 B1 | 12/2001 | Itabashi et al. | |
| 6,395,593 B1 | 5/2002 | Pendharkar et al. | |
| 6,434,019 B2 | 8/2002 | Baudelot et al. | |
| 6,455,905 B1 | 9/2002 | Perugupalli et al. | |
| 6,521,940 B1 | 2/2003 | Vu et al. | |
| 6,556,053 B2 | 4/2003 | Stanley | |
| 6,633,195 B2 | 10/2003 | Baudelot et al. | |
| 6,650,169 B2 | 11/2003 | Faye et al. | |
| 6,781,423 B1 | 8/2004 | Knoedgen | |
| 6,864,131 B2 | 3/2005 | Thornton | |
| 6,876,235 B2 | 4/2005 | Li et al. | |
| 6,900,657 B2 | 5/2005 | Bui et al. | |
| 6,975,023 B2 | 12/2005 | Oliver et al. | |
| 7,116,567 B2 | 10/2006 | Shelton et al. | |
| 7,139,671 B2 * | 11/2006 | Satake | H01L 22/12 702/118 |
| 7,193,396 B2 | 3/2007 | Orr | |
| 7,199,636 B2 | 4/2007 | Oswald et al. | |
| 7,199,640 B2 | 4/2007 | De Cremoux et al. | |
| 7,212,063 B2 | 5/2007 | Müzer et al. | |
| 7,227,198 B2 | 6/2007 | Pavier et al. | |
| 7,239,108 B2 | 7/2007 | Best | |
| 7,304,331 B2 | 12/2007 | Saito et al. | |
| 7,348,687 B2 | 3/2008 | Aichriedler et al. | |
| 7,368,980 B2 | 5/2008 | Benelbar et al. | |
| 7,375,407 B2 | 5/2008 | Yanagihara et al. | |
| 7,378,883 B1 | 5/2008 | Hsueh | |
| 7,382,001 B2 | 6/2008 | Beach | |
| 7,417,257 B2 | 8/2008 | Beach et al. | |
| 7,443,648 B2 | 10/2008 | Cutter et al. | |
| 7,449,730 B2 | 11/2008 | Kuraguchi | |
| 7,453,107 B1 | 11/2008 | Kapoor | |
| 7,465,997 B2 | 12/2008 | Kinzer et al. | |
| 7,477,082 B2 | 1/2009 | Fukazawa | |
| 7,482,788 B2 | 1/2009 | Yang | |
| 7,501,669 B2 | 3/2009 | Parikh et al. | |
| 7,522,435 B2 | 4/2009 | Kohnotoh et al. | |
| 7,538,366 B2 | 5/2009 | Saito et al. | |
| 7,547,964 B2 | 6/2009 | Pavier et al. | |
| 7,548,112 B2 | 6/2009 | Sheppard | |
| 7,550,781 B2 | 6/2009 | Kinzer et al. | |
| 7,612,602 B2 | 11/2009 | Yang et al. | |
| 7,639,064 B2 | 12/2009 | Hsiao et al. | |
| 7,701,009 B2 | 4/2010 | Koyama | |
| 7,714,360 B2 | 5/2010 | Otsuka et al. | |
| 7,719,055 B1 | 5/2010 | McNutt et al. | |
| 7,745,930 B2 | 6/2010 | Connah et al. | |
| 7,746,020 B2 | 6/2010 | Schnetzka et al. | |
| 7,755,108 B2 | 7/2010 | Kuraguchi | |
| 7,782,099 B2 | 8/2010 | Kawamura | |
| 7,800,215 B2 | 9/2010 | Satou et al. | |
| 7,804,328 B2 | 9/2010 | Pentakota et al. | |
| 7,811,872 B2 | 10/2010 | Hoshi et al. | |
| 7,825,435 B2 | 11/2010 | Machida et al. | |
| 7,851,825 B2 | 12/2010 | Suh et al. | |
| 7,851,909 B2 | 12/2010 | Mishra et al. | |
| 7,852,137 B2 | 12/2010 | Machida et al. | |
| 7,855,401 B2 | 12/2010 | Sheppard et al. | |
| 7,863,877 B2 | 1/2011 | Briere | |
| 7,875,907 B2 | 1/2011 | Honea et al. | |
| 7,875,914 B2 | 1/2011 | Sheppard | |
| 7,884,395 B2 | 2/2011 | Saito | |
| 7,893,676 B2 | 2/2011 | Hanna | |
| 7,893,791 B2 | 2/2011 | Ma et al. | |
| 7,898,004 B2 | 3/2011 | Wu et al. | |
| 7,898,509 B2 | 3/2011 | Iida et al. | |
| 7,902,809 B2 | 3/2011 | Briere et al. | |
| 7,906,837 B2 | 3/2011 | Cabahug et al. | |
| 7,915,643 B2 | 3/2011 | Suh et al. | |
| 7,920,013 B2 | 4/2011 | Sachdev et al. | |
| 7,932,539 B2 | 4/2011 | Chen et al. | |
| 7,965,126 B2 | 6/2011 | Honea et al. | |
| 7,973,335 B2 | 7/2011 | Okamoto et al. | |
| 7,982,242 B2 | 7/2011 | Goto | |
| 8,013,580 B2 | 9/2011 | Cervera et al. | |
| 8,018,056 B2 | 9/2011 | Hauenstein | |
| 8,054,110 B2 | 11/2011 | Wang et al. | |
| 8,063,616 B2 | 11/2011 | Bahramian et al. | |
| 8,084,783 B2 | 12/2011 | Zhang | |
| 8,089,139 B2 | 1/2012 | Shi et al. | |
| 8,114,710 B2 | 2/2012 | Muto et al. | |
| 8,188,596 B2 | 5/2012 | Otremba | |
| 8,193,559 B2 | 6/2012 | Haeberlen et al. | |
| 8,193,562 B2 | 6/2012 | Suh et al. | |
| 8,258,622 B2 | 9/2012 | Lee et al. | |
| 8,264,003 B2 | 9/2012 | Herman | |
| 8,289,065 B2 | 10/2012 | Honea et al. | |
| 8,363,437 B2 | 1/2013 | Wang et al. | |
| 8,384,243 B2 | 2/2013 | Adest et al. | |
| 8,441,128 B2 | 5/2013 | Domes | |
| 8,530,904 B2 | 9/2013 | Treu et al. | |
| 8,592,974 B2 | 11/2013 | Wu | |
| 8,681,518 B2 | 3/2014 | Callanan et al. | |
| 8,742,460 B2 | 6/2014 | Mishra et al. | |
| 8,957,692 B2 * | 2/2015 | Shimazawa | G11B 5/105 324/755.05 |
| 2006/0175627 A1 | 8/2006 | Shiraishi | |
| 2007/0164428 A1 | 7/2007 | Elbanhawy et al. | |
| 2007/0210329 A1 | 9/2007 | Goto | |
| 2008/0017998 A1 | 1/2008 | Pavio | |
| 2008/0231211 A1 | 9/2008 | Baarman et al. | |
| 2008/0248634 A1 | 10/2008 | Beach | |
| 2009/0050936 A1 | 2/2009 | Oka | |
| 2009/0072269 A1 | 3/2009 | Suh et al. | |
| 2009/0085219 A1 | 4/2009 | Bayerer | |
| 2009/0278513 A1 | 11/2009 | Bahramian et al. | |
| 2010/0079192 A1 | 4/2010 | Strzalkowski | |
| 2010/0328833 A1 | 12/2010 | Frisch et al. | |
| 2011/0169549 A1 | 7/2011 | Wu | |
| 2011/0298383 A1 | 12/2011 | Muehlschlegel | |
| 2012/0306464 A1 | 12/2012 | Hirler et al. | |
| 2013/0033240 A1 | 2/2013 | Ye | |
| 2013/0222045 A1 | 8/2013 | Wu | |

FOREIGN PATENT DOCUMENTS

| | | |
|---|---|---|
| CN | 101978589 | 2/2011 |
| CN | 102165694 | 8/2011 |
| CN | 102308387 | 1/2012 |
| CN | 103477543 | 12/2013 |

(56) References Cited

FOREIGN PATENT DOCUMENTS

| | | |
|---|---|---|
| EP | 2 188 842 | 5/2010 |
| EP | 2 243 213 | 10/2010 |
| EP | 2 394 303 | 12/2011 |
| JP | 5-075040 | 3/1993 |
| JP | 6-067744 | 3/1994 |
| JP | 2000-101356 | 4/2000 |
| JP | 2000-124358 | 4/2000 |
| JP | 2003-243612 | 8/2003 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2006-223016 | 8/2006 |
| JP | 2007-036218 | 2/2007 |
| JP | 2007-215331 | 8/2007 |
| JP | 2007-252055 | 9/2007 |
| JP | 2007-294769 | 11/2007 |
| JP | 2008-187167 | 8/2008 |
| JP | 2008-198735 | 8/2008 |
| JP | 2008-199771 | 8/2008 |
| JP | 2009-218475 | 9/2009 |
| JP | 2010-539712 | 12/2010 |
| JP | 2011-512119 | 4/2011 |
| JP | 2012-517699 | 8/2012 |
| KR | 10-1998-0021826 | 6/1998 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| TW | 201332085 | 8/2013 |
| TW | 201347143 | 11/2013 |
| WO | WO 2009/036181 | 3/2009 |
| WO | WO 2009/036266 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |
| WO | WO 2013/085839 | 6/2013 |

OTHER PUBLICATIONS

Authorized officer Simin Baharlou, International Preliminary Report on Patentability in PCT/US2008/076160, dated Mar. 25, 2010, 6 pages.
Authorized officer Jae Woo Wee, International Search Report and Written Opinion in PCT/US2009/033699, dated Sep. 21, 2009, 11 pages.
Authorized officer Dorothée Mülhausen, International Preliminary Report on Patentability in PCT/US2009/033699, dated Aug. 26, 2010, 6 pages.
Authorized officer Sung Hee Kim, International Search Report and the Written Opinion in PCT/US2009/057554, dated May 10, 2010, 13 pages.
Authorized Officer Gijsbertus Beijer, International Preliminary Report on Patentability in PCT/US2009/057554, dated Mar. 29, 2011, 7 pages.
Authorized officer Sung Chan Chung, International Search Report and Written Opinion for PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 6 pages.
Authorized officer Bon Gyoung Goo, International Search Report and Written Opinion in PCT/US2010/055129, dated Jul. 1, 2011, 11 pages.
Authorized officer Yolaine Cussac, International Preliminary Report on Patentability in PCT/US2010/055129, dated May 18, 2012, 6 pages.
Authorized officer Sung Joon Lee, International Search Report and Written Opinion in PCT/US2011/020592, dated Sep. 19, 2011, 9 pages.
Authorized officer Philippe Bécamel, International Preliminary Report on Patentability in PCT/US2011/020592, dated Jul. 19, 2012, 7 pages.
Authorized officer Kee Young Park, International Search Report and Written Opinion in PCT/US2011/023485, dated Sep. 23, 2011, 10 pages.
Authorized officer Nora Lindner, International Preliminary Report on Patentability in PCT/US2011/023485, dated Aug. 16, 2012, 7 pages.
Authorized officer Kwak In Gu, International Search Report and Written Opinion in PCT/US2012/026810, dated Jan. 23, 2013, 10 pages.
Authorized officer Lingfei Bai, International Preliminary Report on Patentability in PCT/US2012/026810, dated Sep. 12, 2013, 6 pages.
Authorized officer Sang Won Choi, International Search Report and Written Opinion in PCT/US2013/027294, dated Jun. 26, 2013, 10 pages.
Authorized officer Kihwan Moon, International Preliminary Report on Patentability in PCT/US2013/027294, dated Sep. 4, 2014, 7 pages.
Authorized officer Sung Gon Kim, International Search Report and Written Opinion in PCT/US2014/032241, dated Aug. 11, 2014, 12 pages.
Authorized officer Athina Nickitas-Etienne, International Preliminary Report on Patentabililty in PCT/US2014/032241, dated Oct. 15, 2015, 9 pages.
Authorized officer Hye Lyun Park, International Search Report and Written Opinion in PCT/US2014/045137, dated Oct. 16, 2014, 9 pages.
Authorized officer Agnès Wittmann-Regis, International Preliminary Report on Patentability in PCT/US2014/045137, dated Jan. 21, 2016, 6 pages.
Search Report and Action in TW Application No. 098132132, dated Dec. 6, 2012, 8 pages.
Search Report and Action in TW Application No. 098141930, dated Jul. 10, 2014, 7 pages.
Chinese Third Office Action in Application No. 200980110230.0, dated Jan. 24, 2014, 18 pages.
Japanese Office Action in Application No. 2010-546867, dated Sep. 24, 2013, 14 pages.
Chen et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Choi et al., "AN-9005 Driving and Layout Design for Fast Switching Super-junction MOSFETs," © 2013 Fairchild Corporation, 13 pages.
Huselstein et al., "Use of the MOSFET Channel Reverse Conduction in an Inverter for Suppression of the Integral Diode Recovery Current," 1993, The European Power Electronics Association, pp. 431-436.
Jenkins et al., "The Impact of Parallel GaN HEMTs on Efficiency of a 12-to-1 V Buck Converter," Workshop on Wide Bandgap Power Devices and Applications (WiPDA), 2013 IEEE, pp. 197-200.
Liu et al., Design of a 2 MW DC Supply Using a 4-stage Interleaved DC-DC Converter, in Proc. Energy Conversion Congress and Exposition (ECCE), Sep. 2014 IEEE, pp. 964-970.
Liu et al., "Design and Evaluation of GaN-based Dual-phase Interleaved MHz Critical Mode PFC Converter," In Proc. Energy Conversion Congress and Exposition (ECCE), Sep. 2014 IEEE, pp. 611-616.
Liu et al., "Topology, Cost and Efficiency Comparisons of a 2 MW DC Supply Using Interleaved DC-DC Converter," In Proc. IEEE International Symposium on Power Electronics for Distributed Generation Systems (PEDG), Jun. 2014, 6 pages.
Napierala et al., "Selective GaN Epitaxy on Si(111) Substrates Using Porous Aluminum Oxide Buffer Layers," Journal of the Electrochemical Society, 2006, 153(2):G125-G127, 4 pages.
Reusch and Strydom, "Improving Performance of High Speed GaN Transistors Operating in Parallel for High Current Applications,"

(56) References Cited

OTHER PUBLICATIONS

PCIM Europe May 20-22, 2014; In Proc. International Exhibition and Conference for Power Electronics, Intelligent Motion, Renewable Energy and Energy Management; pp. 302-309.
Rodríguez et al, "Tutorial on Multilevel Converters," International Conference on Power Electronics and Intelligent Control for Energy Conservation, Warsaw, Poland, Oct. 17-19, 2005, 148 pages.
Silicon Labs, Datasheet of Si823x (2015) [online]; available at www.silabs.com, 57 pages.
Waffler and Kolar, "Efficiency Optimization of an Automotive Multi-phase Bi-directional DC-DC Converter," In Proc. 6th International Power Electronics and Motion Control Conference IPEMC '09, May 17-20, 2009, pp. 566-572.
Wang et al., "Investigation of Driver Circuits for GaN HEMTs in Leaded Packages," Workshop on Wide Bandgap Power Devices and Applications (WiPDA), 2014 IEEE, pp. 81-87.
Wu, "Paralleling High-speed GaN Power HEMTs for Quadrupled Power Output," Applied Power Electronics Conference and Exposition (APEC), 2013, pp. 211-214.
Wu et al., "A 97.8% Efficient GaN HEMT Boost Converter with 300-W Output Power at 1 MHz," Electronic Device Letters, 2008, IEEE, 29(8):824-826.
Wu et al., "High-frequency, GaN Diode-free Motor Drive Inverter with Pure Sine Wave Output," PCIM Europe 2012, Conference Digest, pp. 40-43.
Wu et al., "Total GaN Solution to Electrical Power Conversion," the 69th IEEE Device Research Conference, Conference Digest, Jun. 20-22, 2011, pp. 217-218.
Xu et al., "Investigation of 600 V GaN HEMTs for High Efficiency and High Temperature Applications," Applied Power Electronics Conference and Exposition (APEC), Apr. 2014, pp. 131-136.
Zhang et al., "Common-mode Circulating Current Control of Paralleled Interleaved Three-phase Two-level Voltage-source Converters with Discontinuous Space-vector Modulation," IEEE Transactions on Power Electronics, Dec. 2011, 26(12):3925-3935.
Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.
Zhang et al., "Gate Drive Design Considerations for High Voltage Cascode GaN HEMT," Applied Power Electronics Conference and Exposition (APEC), Mar. 2014, pp. 1484-1489.
Zhang et al., "Impact of Interleaving on AC Passive Components of Paralleled Three-phase Voltage-source Converters," IEEE Transactions on Industry Applications, May/Jun. 2010, 46(3): 1042-1054.
Zhou and Wu, "99% Efficiency True-bridgeless Totem-pole PFC Based on GaN HEMTs," PCIM Europe May 14-16, 2013, pp. 1017-1022.

\* cited by examiner

CONDITIONS FOR BURN-IN OF HIGH POWER SEMICONDUCTORS

CROSS-REFERENCE TO RELATED APPLICATION

This patent document claims the priority of U.S. Provisional Application No. 62/486,417, filed on Apr. 17, 2017. The above referenced application is incorporated by reference as part of the disclosure of this document.

TECHNICAL FIELD

This invention relates to semiconductor burn-in methods to achieve increased reliability of high power III-N devices.

BACKGROUND

To date, most transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relatively low switching speeds and high levels of electrical noise. More recently, silicon carbide (SiC) power devices have been considered due to their superior properties. III-N semiconductor devices, such as gallium nitride (GaN) devices, are now emerging as attractive candidates to carry large currents, support high voltages and to provide very low on-resistance and fast switching times. However, reliable fabrication and manufacturing of high-voltage III-N devices has proven to be very difficult

SUMMARY

In one aspect, a plurality of III-N electronic devices are tested, each comprising a source, a gate and a drain. Each of the III-N devices is held at a first temperature less than or equal to 30° C. for a first period of time while applying a first gate-source voltage lower than a threshold voltage of the device an a first drain-source voltage greater than 0.2 times a breakdown voltage of the device. Each of the III-N devices is held at a second temperature greater than the first temperature for a second period of time while applying a second gate-source voltage lower than a threshold voltage of the device and a second drain-source voltage greater than 0.2 times a breakdown voltage of the device. After holding the devices at the first and second temperature, the electrical performance of one or more parameters of each of the devices is tested. Based on the results obtained from testing, at least on device of the plurality of devices is rejected.

In a second aspect, the quality and reliability of a III-N device comprising a package, a gate, a source, and a drain is assured. For a first period of time, a first gate-source voltage below the threshold voltage of the device is applied and a positive drain-source voltage is applied. During the first period of time, the package is held at a first temperature which is below 50% of the maximum operating temperature of the device. After the first period of time, the electrical performance of one or more parameters is tested and based on the results, the device is discarded if it fails to meet one or more of the parameters.

In a third aspect, a wafer of III-N electronic devices, each comprising a source, a gate, and a drain, is tested. The wafer is held at a first temperature less than or equal to 30° C. for a first period of time while simultaneously applying to a plurality of devices a first gate-source voltage lower than a threshold voltage of the devices, and a first drain-source voltage greater than 0.2 times a breakdown voltage of the devices. The wafer is held at a second temperature greater than the first temperature for a second period of time while simultaneously applying to a plurality of devices a second gate-source voltage lower than a threshold voltage of the devices, and a second drain-source voltage greater than 0.2 times a breakdown voltage of the devices. The electrical performance of one or more parameters of each of the devices is tested, and based on the results, at least on device on the wafer is rejected.

As used herein, the term "high temperature" refers to a temperature above ambient room temperature, and in some cases substantially above room temperature. Examples of high temperature can be 50° C. or higher, 85° C. or higher, 150° C. or higher, or in a range of 50° C. to 200° C., 85° C. to 200° C., or 150° C. to 200° C. The high temperature can be created by artificially heating a device, such as on a hot plate or in an oven. The term "low temperature" refers to a temperature which is either at ambient room temperature or at a temperature that is lower than ambient room temperature (e.g., less than the high temperature). Examples of low temperature can be 25° C. or lower, 0° C. or lower, −25° C. or lower, −55° C. or lower, or in a range of −85° C. to 25° C., −85° C. to 0° C., or −85° C. to −25° C. Low temperature can be created by artificial cooling the device, such as in a freezer. In addition, a low temperature can be created by using a hot plate in order to constantly control the temperature to be at or near room temperature.

As used herein, the terms III-Nitride or III-N materials, layers, devices, etc., refer to a material or device comprised of a compound semiconductor material according to the stoichiometric formula $B_wAl_xIn_yGa_zN$, where $w+x+y+z$ is about 1 with $0 \leq w \leq 1$, $0 \leq x \leq 1$, $0 \leq y \leq 1$, and $0 \leq z \leq 1$. III-N materials, layers, or devices, can be formed or prepared by either directly growing on a suitable substrate (e.g., by metal organic chemical vapor deposition), or growing on a suitable substrate, detaching from the originally substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications. As used herein, the "device breakdown voltage" refers to the maximum voltage that can be sustained by the device while the device is biased in the off state such that the device off-state current does not exceed 0.001 times the operating current during regular conduction.

As used herein, a "high-voltage device", e.g., a high-voltage switching transistor, is an electronic device which is optimized for high-voltage switching applications. That is, when the transistor is off, it is capable of blocking high voltages, such as about 300V or higher, about 600V or higher, or about 1200V or higher, and when the transistor is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, or other suitable blocking voltage required by the application.

As used herein, a "III-Nitride" or "III-N device" is a device based on III-N materials. The III-N device can be designed to operate as an enhancement-mode (E-mode) transistor device, such that the threshold voltage of the device (i.e., the minimum voltage that must be applied to the gate relative to the source in order to turn the device on) is positive. Alternatively, the III-N device can be a depletion-mode (D-mode) device, having a negative threshold voltage. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, or higher. When the high voltage device is biased on (e.g., the voltage on the gate relative to the source is greater than the device threshold voltage), it is able to conduct substantial current with a low on-voltage. The maximum allowable on-voltage is the maximum voltage that can be sustained in the application in which the device is used.

As used herein, the "operating temperature range" of a device is the range between the minimum and the maximum specified operating temperature of the device. In some applications, the minimum specified operating temperature of a device is −50° C. and the maximum specified operating temperature of the device is 150° C. The median operating temperature range is the mid-point of the operating temperature range.

The details of one or more disclosed implementations of the subject matter described in this specification are set forth in the accompanying drawings and the description below. Other features, aspects, and advantages will become apparent from the description, the drawings and the claims.

DESCRIPTION OF DRAWINGS

FIG. 4 is an $I_{DS}$ leakage plot before and after burn-in.

FIG. 5 is an on-resistance plot before and after burn-in.

DETAILED DESCRIPTION

Figure 1:
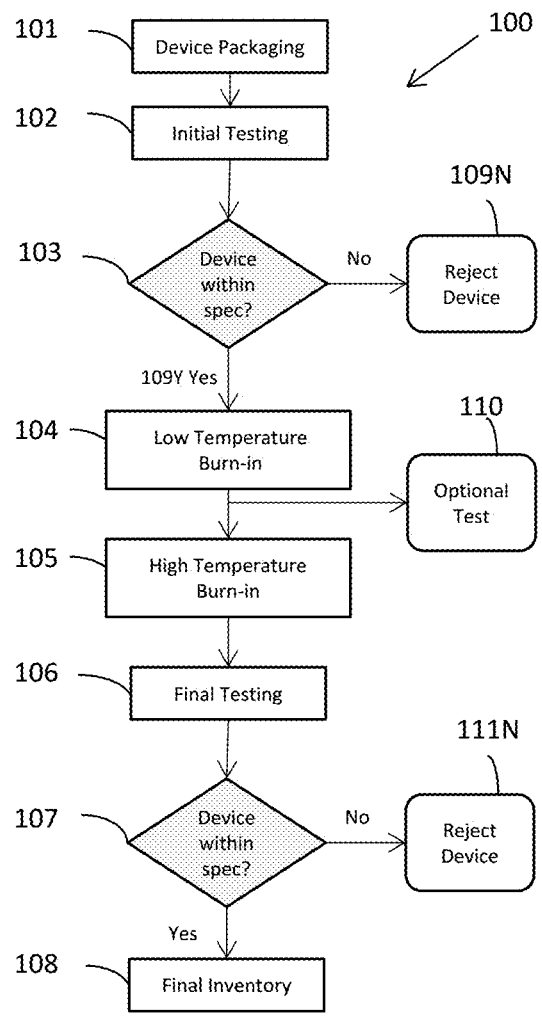
FIG. 1 is a flow diagram for burn-in testing of a packaged device.

The reliability of III-N based devices has been the subject of much investigation over the last decade. Substantial progress has been made in demonstrating the viability of this technology. Yet, especially in the power market, the technology is still gaining general acceptance. Power devices, while similar to RF III-N devices, are subjected to much higher voltages in the off-state during circuit operation. These high voltages lead to different stability issues in the devices, thereby requiring a need to develop a robust device screening procedure which can accurately remove all weak devices. Such a procedure preferably screens devices which could exhibit early lifetime failure, or "infant mortality", before the devices enter commercial applications. Electronic components often fail due to flaws resulting from the fabrication and manufacturing process. These components are commonly subjected to probe testing after completion to detect devices which do not electrically match the design criteria. However, probe testing typically will not detect devices with "latent" defects and some devices which pass probe testing can still result in early-life failure or infant mortality of the device.

A method to reduce the occurrence of infant mortality is to subject the devices to accelerated life-time testing. A method of accelerated life-time testing, or stress test, is known as "burn-in." Burn-in testing can be a critical process to assure high product reliability of new technologies, especially during their introduction phase. A type of burn-in can be increasing the temperature and voltage of a device for a set period of time beyond the typical operating temperature and voltage of the device. This will accelerate the failure of devices with latent defects that were not identified during initial probe testing and allow for their removal from known good parts before the devices enter their intended field of use.

Unfortunately, this type of burn-in is a lengthy process and can require significant capital expenditures to implement. III-N devices, in particular, could require hundreds of hours of burn-in to accurately detect all latent defects. It is therefore a desire to minimize the time required for burning-in devices. One method to reduce the required burn-in time is to increase the temperature or voltage of the burn-in test, however III-N devices cannot withstand severe burn-in conditions and can begin to incur different failure mechanisms, such as an increase of dynamic on-resistance beyond the specification.

Silicon based semiconductor devices typically result in latent defects from the manufacturing of the device but do not suffer from defects in the bulk silicon substrate. These silicon device defects can be accelerated by increasing the temperature of the burn-in test to a temperature that is higher than the typical operating temperature of the device. Burn-in can be performed on silicon devices at temperatures between 90° C. to 150° C. for anywhere between 24 to 168 hours. These conditions, however, may not be suitable for burn-in testing for III-N devices. III-N devices can suffer from defects found in the bulk III-N material layers of the device (EPI defects) as well as from the manufacturing of the electrical metal routing layers and passivation layers (e.g., device layers) over the III-N material layers. These different types of defects can exhibit different activation energy and may not respond to an accelerated life-time testing in the same manner. In order to reduce the burn-in time and successfully screen latent defects in III-N devices it may be required to perform burn-in testing at multiple temperatures, voltages and times.

FIG. 1 is an example flow diagram 100 showing process steps 101-111N of a burn-in process for screening out III-N devices with latent defects or possible early lifetime failures before they enter commercial use. Before a III-N device can enter the process flow of FIG. 1, wafer fabrication of all the devices must be completed. Each wafer typically contains a plurality of III-N semiconductor devices. Once wafer fabrication has been completed, each of the III-N devices is electrically tested on-wafer to measure one or more critical electrical parameters, for example measuring on-resistance ($R_{ON}$), off-state drain leakage ($I_{DS}$), and threshold voltage ($V_{TH}$). Devices which fail to meet minimum performance criteria for each of the critical electrical parameters are screened out and marked with an ink so as to avoid accidental assembly of these devices into final packages. After on-wafer testing is complete, the wafer is sawed (or diced) between scribe lines and each "good" die (i.e., non-inked III-N device) is subjected to further assembly and packaging.

At 101, each diced non-inked III-N device is packaged. Here, each III-N device that electrically measures within the critical parameters of the on-wafer testing is assembled into a final package. This involves mounting the device into a metal, plastic or ceramic casing. The package holds the contact leads which are used to connect the device to external circuits. It also acts to dissipate heat and protect the device from the external environment. The package can be a discrete electronic package or an electronic module containing multiple semiconductor devices.

At 102, each packaged III-N device undergoes initial testing. The initial testing can include a variety of electrical tests. These typically include measuring on-resistance ($R_{ON}$), off-state drain leakage ($I_{DS}$), and threshold voltage ($V_{TH}$). These test can be performed at room temperature or at an elevated temperature, for a period of time of one second or less. The main purpose of testing the packaged III-N device at this step is to screen out any defects or mechanical failures caused by the device packaging performed at 101 (e.g., broken wire bond or poor solder interface). The short duration of these tests are insufficient to detect devices with latent defects.

After the initial testing performed at 102, each of the performance parameters of the packaged III-N devices are compared, at 103, against the device specification. If the device fails to meet a minimum specification, the device is rejected at 109N. Passing devices are sent through, at 109Y, to an accelerated lifetime test, known as a stress test, or burn-in test.

During the burn-in test, the packaged III-N device can be put into a socket mounted on a printed circuit board (PCB), or directly soldered to a PCB. The PCB can be configured to test a plurality of devices simultaneously. The PCB can be installed into a testing chamber that has a temperature controller. The temperature controller can be capable of controlling the testing chamber temperature between −50° C. and 200° C. The packaged device is then stressed under a positive voltage bias from drain to source while in the off-state (i.e., while the gate is biased relative to the source below the device threshold voltage) for a specified period of time. The drain-source voltage of the device may be biased at a voltage which is equal to or greater than the typical operating voltage of the device. The device may be biased at a voltage which is greater than the specification of the device as listed on the data sheet. Since the III-N devices described herein are high-voltage devices, the burn-in step may be performed at a voltage greater than 400V, greater than 600V, greater than 900V or greater than 1200V. In some implementations, the drain-source voltage of the device during burn-in testing is at least 0.2 times, at least 0.4 times, at least 0.5 times, at least 0.6 times, at least 0.7 times, or at least 0.8 times the device breakdown voltage. Furthermore, the drain-source voltage of the device may be stepped between multiple voltages during the burn-in process.

The specified period of time used for a burn-in process can affect the production capacity, the cost, and the time to market of a finished product. As a result, the lowest duration burn-in time is desired which can still accurately capture all early lifetime failures. Burn-in practice for silicon based semiconductor devices involves increasing the temperature and voltage beyond the typical operating temperature and voltage of the device. This is done in order to stress the device at levels that are beyond the typical operating conditions the device would see during normal applications. In many cases, for burn-in testing of silicon based semiconductor devices, increasing the temperature, the bias voltage, or both reduces the time required for a burn-in process while still allowing devices which would have otherwise exhibited early failure to be screened out. This is due to the positive activation energy that latent defects typically exhibit in silicon based devices. Often times, for silicon based devices, the burn-in process may be conducted at a temperature or voltage beyond the specification rating of the device as found on the data sheet. This is done in order to reduce the required burn-in time even further. Examples of burn-in times can be as much as 24 hours to 168 hours.

However, III-N based semiconductor devices have been found to also exhibit different failure mechanisms in addition to those typically found in silicon based semiconductor devices. Exposing III-N devices to high temperature burn-in can inject charge into the device and relax certain types of defects with negative activation energy, actually making the device stronger. This would indicate that performing the burn-in test at elevated temperatures could increase the time required to screen devices containing certain types of latent defects.

It has been found that the burn-in process can be improved for III-N devices by performing burn-in at multiple temperatures. For example, two burn-in steps can be performed sequentially, each at their own temperature. The first step can be a low temperature burn-in step, and the second step can be a high-temperature burn-in step. In some implementations, more than two burn-in steps can be performed. For example, three, four, five, or more different burn-in steps, each performed sequentially at a different temperature, e.g., at sequentially higher temperatures, could be used to screen the device. In the example shown in FIG. 1, the process 100 includes a first burn-in step performed at a low temperature, and a second burn-in step performed at a high temperature after the first step. As stated above, certain types of defects found in III-N devices have a negative activation energy and can be relaxed by a high temperature process. As such, it can beneficial to perform the low temperature burn-in before the high temperature burn-in. This will allow for the successful screening of defects which exhibit this behavior. Next, the defects which have positive activation energy can be screened during the high-temperature burn-in. However, in another implementation of the process 100, the high temperature burn-in step can be performed before the low temperature burn-in step.

At 104, a low temperature burn-in of III-N packaged devices is performed. One example of a low temperature burn-in can be performed at ambient room temperature (e.g., no artificial increase of the packaged III-N device temperature). In some instances, a hot plate or oven may be used to control the temperature at or near room temperature. The indicated temperature typically refers to the device package case temperature. Since the burn-in process is performed while the device is biased in the off state (i.e., where the gate is biased below the device threshold voltage relative to the source), the device does not dissipate much power, and therefore device self-heating is minimal. Another example of low temperature burn-in can be performed at a temperature below ambient room temperature. In order to perform the burn-in process below room temperature, the packaged device can be artificially cooled (e.g., placed in a freezer). Artificially cooled devices can be maintained under constant nitrogen purge to reduce the humidity and prevent condensation from forming and shorting the device. During low temperature burn-in, examples of temperatures the device may be stressed at are 30° C. or lower, 0° C. or lower, −25° C. lower, −50° C. or lower or the lowest specification temperature listed on the device data sheet. Temperatures used for a low temperature burn-in may even be below the minimum specified operating temperature of the device listed on the data sheet. The temperature can be less than the median operating temperature range of the device. The time used for low temperature burn-in can be less than 96 hours, less than 48 hours, or less than 24 hours. The time used can be greater than 0.5 hours, greater than 1 hour, greater than 24 hours, greater than 48 hours, between 1 hour and 96 hours or between 24 hours and 96 hours.

At 110, a test can optionally be performed to screen out packaged III-N devices which do not meet specific critical parameters after the low temperature burn-in. Performing this screening can eliminate the failed III-N devices from utilizing further resources during the high temperature burn-in step. In some cases, it is preferable that this step be omitted, as it can increase testing time, thereby decreasing product cycle time.

At 105, a high temperature burn-in of III-N packaged devices is performed. High temperature burn-in can be performed by heating the device, typically by placing the device on a hot plate or in an oven. Examples of high temperature can be 50° C. or higher, 85° C. or higher, or 150° C. or higher. The temperature can be greater than the median operating temperature range of the III-N device. The temperature can be greater than the maximum specified operating temperature of the III-N device.

During the low temperature burn-in and the high temperature burn-in, the gate of the device is biased relative to the source below the threshold voltage of the device while a positive voltage is applied to the device drain relative to the source for a specified period of time. It is desirable to use the lowest specified period of time required to successfully screen out latent defects. The time used for high temperature burn-in can be less than 96 hours, less than 48 hours, or less than 24 hours. The time used can be greater than 0.5 hours, greater than 1 hour, greater than 24 hours, greater than 48 hours, between 1 hour and 96 hours or between 24 hours and 96 hours.

The specified period of time for the low temperature burn-in can be the same time as the high temperature burn-in or it can be substantially different than the time for the high temperature burn-in. In one example, the time of the low temperature burn-in can be between 24 hours and 96 hours, and the time for the high temperature burn-in can be between 24 hours and 96 hours. In another example, the time for both burn-in temperatures can be 24 hours or less.

In addition, the positive drain-source voltage applied during the low temperature burn-in can be the same drain-source voltage applied during the high temperature burn-in, or the voltages applied can be different. In one example, the drain-source voltage of the III-N device applied during the low temperature burn-in is at least 0.2 times the device breakdown voltage and the drain-source voltage applied during the high temperature burn-in is at least 0.2 times the device breakdown voltage. In another example, the drain-source voltage applied during both burn-in temperatures is 400V or higher. Furthermore, the drain-source voltage of the device may be stepped between multiple voltages during the high temperature or the low temperature burn-in process steps.

At 106, each packaged III-N device undergoes final testing. The final testing can include a variety of electrical tests. These typically include measuring on-resistance ($R_{ON}$), off-state drain leakage ($I_{DS}$), and threshold voltage ($V_{TH}$). These test parameters can be the same as those tested at 102. At 107, packaged devices which show critical test parameters out of specification or devices which show a statistical deviation out of family compared to the initial testing 102 results can be rejected as shown at 111N. Rejected devices are removed from the plurality of devices and are not considered for commercial use. For example, devices that are within 10% or greater of the maximum specified value of the test parameter can be rejected. In addition, devices which show a dynamic on-resistance increase of 25% or more from the initial testing can be rejected. Devices which show an off-state drain leakage greater than 1 µA can be rejected.

At 108, all devices which have completed the low temperature burn-in and the high temperature burn-in and still meet the desired device performance requirements can be placed into final inventory 108 and be released for commercial use.

Figure 2:
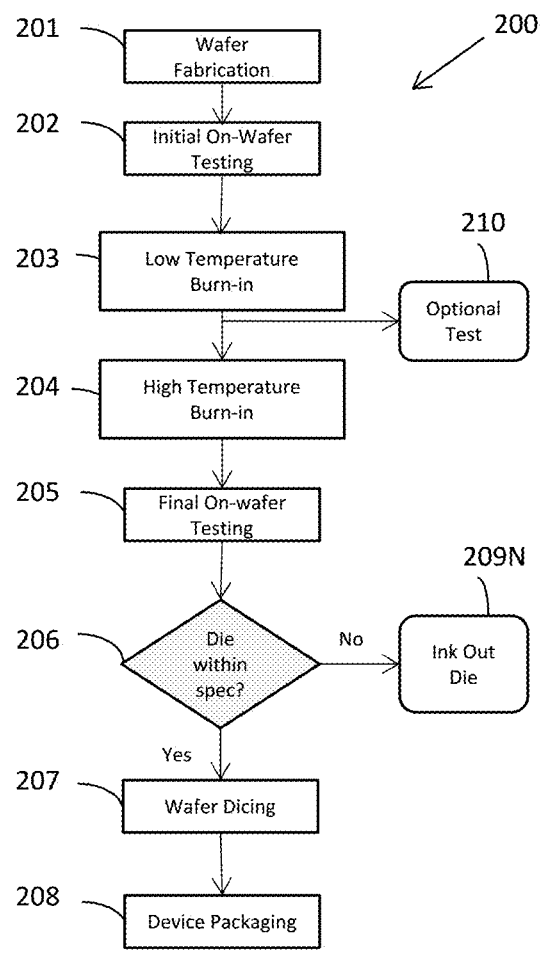
FIG. 2 is a flow diagram for burn-in testing of wafer level devices.

FIG. 2 is an example flow diagram 200 showing process steps 201-210 of an alternative process used to perform burn-in on III-N semiconductor based devices. Flow diagram 200 is directed towards on-wafer burn-in testing before the plurality of devices are packaged. An on-wafer burn-in test can be desirable to reduce packaging time and cost. Burn-in testing of individually packaged parts can require a large amount of capital expenditure and equipment in order to test large numbers of parts. On-wafer testing can reduce the equipment required to conduct burn-in by having one testing apparatus stress a plurality of devices on a wafer simultaneously. In addition, screening devices with latent defects before packaging can save the time and resources required to package defective parts.

Wafer fabrication at 201, can include multiple fabrication processes, each which can result in the occurrence of device defects. Each wafer typically contains a plurality of III-N semiconductor devices. Once wafer fabrication is completed, each III-N device is electrically tested to measure one or more critical parameters. These typically include measuring on-resistance ($R_{ON}$), off-state drain leakage ($I_{DS}$), and threshold voltage ($V_{TH}$). The initial on-wafer testing is shown at 202 of FIG. 2. These test can be performed at room temperature or at an elevated temperature, typically for a period of time of one second or less. The short duration of these tests are insufficient to detect devices with latent defects.

At 203, a plurality of devices on the wafer can be simultaneously subjected to low temperature burn-in testing. This is done by employing a specially made testing apparatus, called a probe card, which has contact points that match the specific device layout on the wafer. The probe card can contain spring-like electrodes which extend away from the probe card. These spring like electrodes, when lowered towards the wafer surface, can contact each device electrode and apply the desired bias voltages required for burn-in to a plurality of devices simultaneously. Furthermore, low temperature burn in 203 and high temperature burn-in 204 can be completed sequentially. Low temperature burn-in 203 and high temperature burn-in 204 can have the same process requirements as low temperature burn-in 104 and high temperature burn-in 105, respectively, previously described with reference to process 100 in FIG. 1.

As shown in FIG. 2, low temperature burn-in 203 occurs before high temperature burn-in 204, but alternatively, the flow diagram steps could be reversed (not shown). The burn-in testing apparatus can be set up with a thermally controlled hot plate, or wafer chuck. In one example, the low temperature burn-in is performed by leaving the thermally controlled hot plate turned off and holding the wafer temperature at ambient room temperature at or below 30° C. while applying the desired voltage bias, and the high temperature burn in is performed by setting the hot plate temperature to a temperature higher than the low temperature, for example at 50° C. or higher, while applying the desired voltage bias. The time of the low temperature burn-in or the high temperature burn-in can be greater than 1 hour, greater than 24 hours, or greater than 48 hours. In addition, the time of the low temperature burn-in or the high temperature burn-in can be less than 96 hours, or less than 24 hours. An optional test step 210 can be performed between the low temperature burn-in 203 and the high temperature burn-in 204. This testing step will allow the identification of the burn-in step which is responsible for specific device failures. However, it is not always desirable to perform this step as it increases wafer testing costs and wafer cycle time.

At 205, the wafer is placed into final on-wafer testing after completion of the burn-in processes. The final on-wafer testing can include a variety of electrical tests. These tests typically include measuring on-resistance ($R_{ON}$), off-state drain leakage ($I_{DS}$), and threshold voltage ($V_{TH}$). These test parameters can be the same as those tested in the on-wafer testing process step 202. The III-N devices which show critical test parameters out of specification or devices which show a statistical deviation out of family compared to the initial on-wafer testing 202 results can be rejected at 209N. Rejected devices are screened out and marked with an ink so as to avoid accidental assembly of these devices into final device packages. After final on-wafer testing is complete, the wafer is sawed (or diced) between scribe lines and each "good" die (i.e., non-inked III-N device) is subjected to further assembly and packaging. This packaging can be the same device packaging as described in 101 of FIG. 1.

Figure 3:
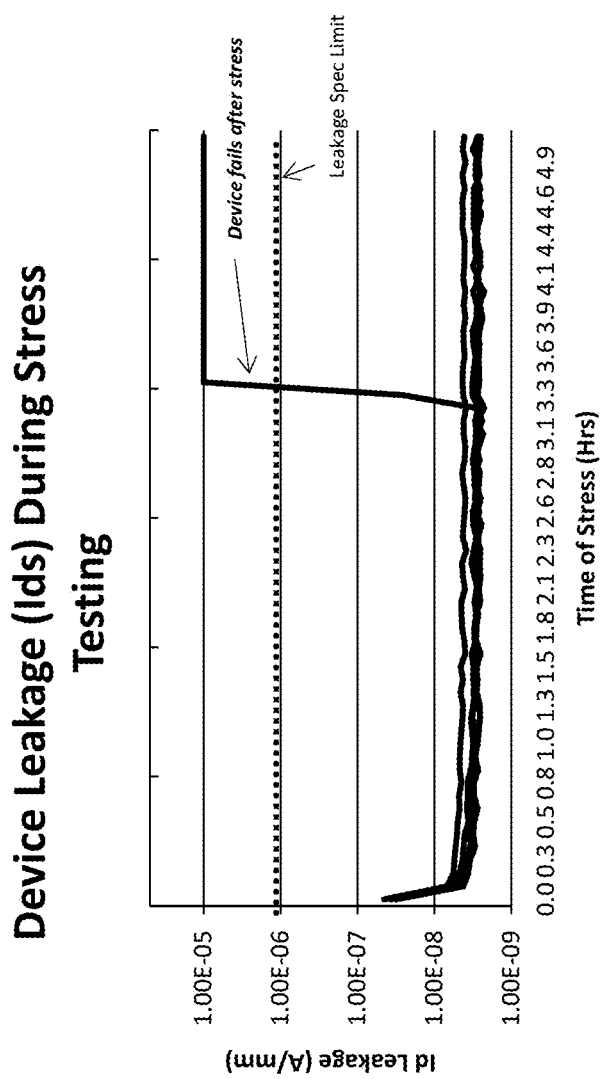
FIG. 3 is an $I_{DS}$ leakage vs time plot during a burn-in test.

FIG. 3 shows an example data collection chart during a burn-in process. FIG. 3 shows how the off-state drain-source leakage ($I_{DS}$) of a device can change over time during burn-in testing. Devices which contain latent defects can fail during the burn-in process, and as a result the leakage can drastically increase beyond a specification level. FIG. 3 shows a device off-state drain-source leakage specification of 1 µA and a single device exceeding this limit after a time of 3.2 hours, which can then be rejected after the completion of the burn-in test. This chart could be used as a model to determine the required burn-in time to successfully screen defective devices, by setting a time at which no additional devices are found to fail with similar failure modes.

Figure 4:
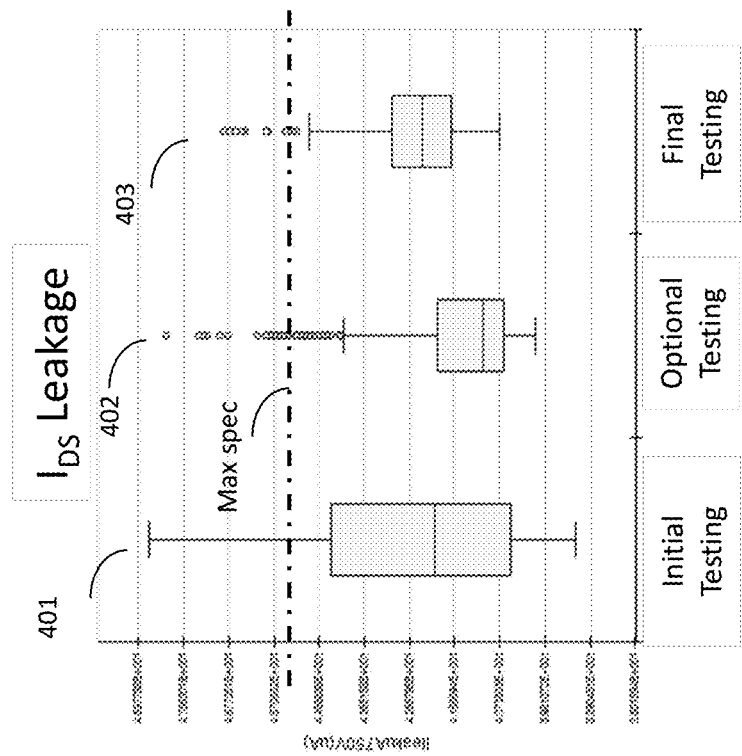

FIG. 4 shows an example box plot of the drain leakage ($I_{DS}$) of a plurality of packaged III-N devices before and after the burn-in testing is performed. Box plot 401 shows the an example $I_{DS}$ leakage after initial testing process step 102 as shown in FIG. 1. Box plot 402 shows an example $I_{DS}$ leakage of the same III-N devices after low temperature burn-in at optional testing 110. Furthermore, box plot 403 shows an example $I_{DS}$ leakage plot of the same III-N devices after high temperature burn-in at final testing 106. FIG. 4 shows an example maximum specified $I_{DS}$ of 4.5 µA. Devices exhibiting leakage within 10% of the maximum specified $I_{DS}$ or greater can be rejected from the plurality of devices after testing step 102. Furthermore, devices experiencing leakage within 10% of the maximum specified $I_{DS}$ or greater after optional testing step 110 and final testing step 106 can be removed from the plurality of devices being allowed into commercial applications. For example, devices which show an off-state drain leakage greater than 1 µA can be rejected.

Figure 5:
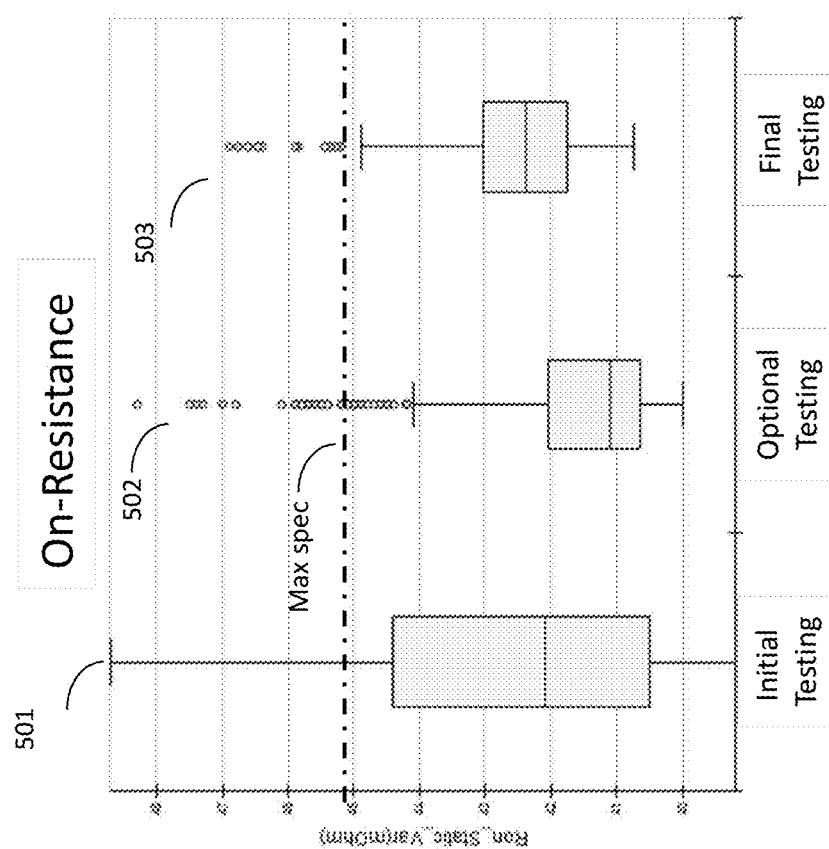

FIG. 5 shows an example box plot of on-resistance ($R_{ON}$) of a plurality of packaged III-N devices. Box plot 501 shows an example $R_{ON}$ of devices after initial testing process step 102 as shown in FIG. 1. Box plot 502 shows an example $R_{ON}$ after low temperature burn-in at optional testing step 110 of FIG. 1. Box plot 503 shows an example $R_{ON}$ after final testing 106 of FIG. 1. FIG. 5 shows an example maximum specified $R_{ON}$ of 45 mohms. Devices that are within 10% or greater of the maximum specified $R_{ON}$ can be rejected from the plurality of devices after testing step 102. Furthermore, devices that are within 10% or greater of the maximum specified $R_{ON}$ after optional testing step 110 and final testing step 106 can be removed from the plurality of devices being allowed into commercial applications. In addition, individual devices which show an on-resistance or a dynamic on-resistance increase of 25% or more from the initial testing can be rejected. For on-wafer testing, an entire wafer can be rejected if the cumulative burn-in yield is, for example, less than 90% or less than 80%.

A number of implementations have been described. Nevertheless, it will be understood that various modifications may be made without departing from the spirit and scope of the techniques and devices described herein. Accordingly, other implementations are within the scope of the following claims.

What is claimed is:

1. A method of testing a plurality of III-N devices each comprising a source, a gate, and a drain, the method comprising:
   for each device, holding the device at a first temperature less than or equal to 30° C. for a first period of time while applying a first gate-source voltage lower than a threshold voltage of the device and a first drain-source voltage greater than 0.2 times a breakdown voltage of the device;
   for each device, holding the device at a second temperature greater than the first temperature for a second period of time while applying a second gate-source voltage lower than the threshold voltage of the device and a second drain-source voltage greater than 0.2 times the breakdown voltage of the device;
   after holding the devices at the first and second temperatures, testing electrical performance of one or more parameters of each of the devices; and
   based on results obtained from the testing, rejecting at least one device of the plurality of devices.

2. The method of claim 1, wherein the first period of time or the second period of time is greater than 24 hours.

3. The method of claim 1, wherein the second temperature is greater than 50° C.

4. The method of claim 1, wherein each of the devices is rated for operation at a minimum operating temperature, and the first temperature is less than or equal to the minimum operating temperature.

5. The method of claim 1, wherein the second temperature is greater than or equal to a median operating temperature range.

6. The method of claim 1, wherein one of the electrical performance-tested parameters is a dynamic on-resistance; and
a device is rejected if the dynamic on-resistance is within 10% or greater of a maximum specified dynamic on-resistance.

7. The method of claim 1, wherein one of the electrical performance-tested parameters is an on-resistance; and
a device is rejected if an increase of the on-resistance is 25% or greater compared to a previous test of the device on-resistance.

8. The method of claim 1, wherein one of the electrical performance-tested parameters is an off-state drain-source leakage; and
a device is rejected if the off-state drain-source leakage is within 10% or greater of a maximum specified off-state drain-source leakage.

9. The method of claim 1, wherein one of the electrical performance-tested parameters is an off-state drain-source leakage; and
a device is rejected if the off-state drain-source leakage is greater than 1 µA.

10. The method of claim 1, further comprising
holding the device at one or more additional temperatures for corresponding periods of time while the drain-source voltage is greater than 0.2 times the breakdown voltage of the device,
wherein the one or more additional temperatures are different from the first temperature and the second temperature.

11. The method of claim 2, further comprising packaging the plurality III-N devices into an electronic package prior to testing; wherein
the packaged devices are mounted into a printed circuit board, and the printed circuit board is configured to test the plurality of III-N device simultaneously.

12. The method of claim 11, wherein the first or second drain-source voltage is greater than 400V.

13. A method of assuring quality and reliability of a III-N device, the device including a package, a gate, a source, and a drain, the method comprising:
for a first period of time, applying a first gate-source voltage below a threshold voltage of the device and applying a positive drain-source voltage;
holding the package at a first temperature which is below a median operating temperature range of the device for the first period of time; and
after holding the devices at the first temperature, testing electrical performance of one or more parameters of the device; and
based on results obtained from the testing, rejecting the device if the performance is not within an acceptable range of one or more of the electrical performance-tested parameters.

14. The method of claim 13, further comprising, holding the device at a second temperature which is greater than a median operating temperature range of the device for a second period of time; and
after holding the device at the second temperature, testing again the electrical performance of one or more parameters of the device; and
based on the results obtained from the testing again, rejecting the device if the performance is not within an acceptable range of one or more of the electrical performance-tested parameters.

15. The method of claim 14, wherein the first period of time is greater than 24 hrs.

16. The method of claim 15, wherein the first period of time is less than 96 hours.

17. The method of claim 14, wherein the positive drain-source voltage is greater than 0.2 times a breakdown voltage of the device.

18. The method of claim 14, wherein one of the electrical performance-tested parameters is an off-state drain-source leakage; and
a device is rejected if the off-state drain-source leakage is greater than 1 µA.

19. The method of claim 14, wherein one of the electrical performance-tested parameters is a dynamic on-resistance; and
a device is rejected if the dynamic on-resistance is within 10% or greater of a maximum specified dynamic on-resistance.

20. The method of claim 14, wherein the first temperature is below 50° C.

21. The method of claim 20, wherein the second temperature is greater than 50° C.

22. A method of testing a wafer including a plurality of III-N electronic devices each comprising a source, a gate, and a drain, the method comprising:
holding the wafer at a first temperature less than or equal to 30° C. for a first period of time while simultaneously applying to a plurality of the devices a first gate-source voltage lower than a threshold voltage of the device and a first drain-source voltage greater than 0.2 times a breakdown voltage of the device;
holding the wafer at a second temperature greater than the first temperature for a second period of time while simultaneously applying to a plurality of the devices a second gate-source voltage lower than the threshold voltage of the device and a second drain-source voltage greater than 0.2 times the breakdown voltage of the device;
after holding the wafer at the first and second temperatures, testing electrical performance of one or more parameters of each of the devices; and
based on results obtained from the testing, rejecting at least one device on the wafer.

23. The method of claim 22, wherein the first and second periods of time are each greater than 1 hour.

24. The method of claim 23, wherein a testing apparatus has a thermally controlled hot plate, and the wafer is on the hot plate; wherein
during the first period of time, the hot plate is turned off; and
during the second period of time, the hot plate controls a wafer temperature.

25. The method of claim 24, wherein during the second period of time, the hot plate controls the wafer temperature to greater than 50° C.

26. The method of claim 22, wherein the rejected devices are inked on the wafer and the non-inked devices are assembled into a discrete electronic package.

27. The method of claim 22, wherein one of the electrical performance-tested parameters is a dynamic on-resistance; and
    a device is rejected if the dynamic on-resistance is within 10% or greater of a maximum specified dynamic on resistance.

28. The method of claim 22, wherein one of the electrical performance-tested parameters is an off-state drain-source leakage: and
    a device is rejected if the off-state drain-source leakage is within 10% or greater of a maximum specified off-state drain-source leakage.

29. The method of claim 22, wherein one of the electrical performance-tested parameters is an on-resistance; and
    a device is rejected if an increase of the on-resistance is 25% or greater compared to a previous test of the device on-resistance.

30. The method of claim 22, wherein one of the electrical performance-tested parameters is an off-state drain-source leakage; and
    a device is rejected if the off-state drain-source leakage is greater than 1 µA.

31. A system for testing a plurality of III-N devices, the system comprising:
    a testing chamber and a temperature controller; wherein
    the temperature controller is configured to hold the plurality of devices at a first temperature less than or equal to 30° C. for a first period of time; and
    during the first period of time, the testing chamber is configured to apply a first gate-source voltage lower than a threshold voltage of the device and a first drain-source voltage greater than 0.2 times a breakdown voltage of the device; and
    the temperature controller is configured to hold the plurality of devices at a second temperature greater than or equal to 30° C. for a second period of time; and
    the during the second period of time, the testing chamber is configured to apply a second gate-source voltage lower than the threshold voltage of the device and a second drain-source voltage greater than 0.2 times the breakdown voltage of the device; wherein
    the first period of time and the second period of time is greater than 1 hour.

32. A method of testing a plurality of III-N devices each comprising a source, a gate, and a drain, the method comprising:
    for each device, holding the device at a first temperature for a first period of time while applying a first gate-source voltage lower than a threshold voltage of the device and a first drain-source voltage greater than 0.2 times a breakdown voltage of the device;
    for each device, holding the device at a second temperature for a second period of time while applying a second gate-source voltage lower than the threshold voltage of the device and a second drain-source voltage greater than 0.2 times the breakdown voltage of the device, wherein the second temperature is smaller than the first temperature and smaller than 30° C.;
    after holding the devices at the first and second temperatures, testing electrical performance of one or more parameters of each of the devices; and
    based on results obtained from the testing, rejecting at least one device of the plurality of devices.

33. The method of claim 32, wherein the first temperature is greater than 50° C.

34. The method of claim 32, wherein each of the devices is rated for operation at a minimum operating temperature, and the second temperature is smaller than or equal to the minimum operating temperature.

35. The method of claim 32, wherein the first temperature is greater than or equal to a median operating temperature range.

\* \* \* \* \*